(12) United States Patent
Seno

(10) Patent No.: US 6,222,410 B1
(45) Date of Patent: Apr. 24, 2001

(54) SEMICONDUCTOR CIRCUIT

(75) Inventor: Katsunori Seno, Kanagawa (JP)

(73) Assignee: Sony Coorporation, Tokyo (JP)

( * ) Notice: Subject to any disclaimer, the term of this patent is extended or adjusted under 35 U.S.C. 154(b) by 0 days.

(21) Appl. No.: 09/342,064

(22) Filed: Jun. 29, 1999

(30) Foreign Application Priority Data

Jun. 30, 1998 (JP) .................................................. 10-184374

(51) Int. Cl.$^7$ ...................................................... G06F 1/04
(52) U.S. Cl. ........................................... 327/293; 327/144
(58) Field of Search ................................... 327/141, 262, 327/144, 269, 293, 270, 295, 271, 296, 284

(56) References Cited

U.S. PATENT DOCUMENTS 4,890,016 * 12/1989 Tanaka et al. ........................... 326/27
5,654,651 * 8/1997 Kaneko et al. ....................... 326/121

OTHER PUBLICATIONS

ISSCC95/Session 19/Technology Directions: Quantum Computing & Low–Power Digital, "FP 19.4: 50% Active Power Saving without Speed Degradation using Standby Power Reduction(SPR) Circuit".

IEEE Journal of Solid–State Circuits, vol. 30, No. 8, Aug. 1995 , "1–V Power Supply High–Speed Digital Circuit Technology with Multithreshold–Voltage CMOS".

IEEE Journal of Solid–State Circuits, vol. 31, No. 11, Nov. 1996, "A 160–MHz, 32–b, o.5–W CMOS RISC Microprocessor".

IEE Journal of Solid–State Circuits, vol. 32, No. 11, Nov. 1997, "A 1–V Programmable DSP for Wireless Communications".

* cited by examiner

Primary Examiner—Toan Tran
Assistant Examiner—Linh Nguyen
(74) Attorney, Agent, or Firm—Ronald P. Kananen; Rader, Fishman & Grauer

(57) ABSTRACT

A semiconductor circuit capable of keeping the leakage current to a minimum while drawing out the effect of improvement of speed due to the lowering of the threshold voltage to a maximum, wherein delay paths to which low threshold voltage gate elements are applied are restricted to delay paths in a range from a maximum delay value before a lowering of a threshold voltage (at a higher speed than this) to a new maximum delay value in a case where low threshold voltage gate elements are applied to this (at a lower speed than this), whereby a leakage current due to low threshold voltage transistors can be kept to the minimum while drawing out the effect of improvement of speed due to the lowering of the threshold voltage to the maximum, thereby solving the problem of an unrequired leakage current applied to a chip over a wide range.

8 Claims, 10 Drawing Sheets

SEMICONDUCTOR CIRCUIT

BACKGROUND OF THE INVENTION

1. Field of the Invention

The present invention relates to a semiconductor circuit which has a plurality of transmission paths and in which transmission elements having smaller amounts of delay are arranged in the transmission paths that have a smaller value than the absolute value of the threshold voltage set.

2. Description of the Related Art

In recent years, semiconductor circuits have generally adopted the technique of lowering the power supply voltage VDD for lowering the power. In order to compensate for the deterioration of a transmission rate due to the reduction of the voltage, the transfer gates serving as the transmission elements arranged in each transmission interconnection path and the transistors constituting the logic circuits are being made low threshold voltage transistors having a lower threshold voltage Vth than that of usual transistors. In general, the speed v and the power supply voltage VDD satisfy the following relationship:

$$v \; VDD/(VDD-Vth)^A \quad (1)$$

Here, A is a coefficient affected by speed saturation and is 1 to 2.

As seen from equation (1), by making the threshold voltage Vth small, the decline in the speed can be alleviated even if the power supply voltage VDD is lowered.

Summarizing the problem to be solved by the invention, the sub threshold leakage current $I_L$ of a transistor is abruptly increased by a reduction of the threshold voltage Vth of the transistor as represented by the following equation (2):

$$I_L \; \exp(-Vth/S) \quad (2)$$

Here, S is a sub threshold swing and is generally about 80 mV/dec.

In the related art, this low threshold voltage transistor was used over the entire semiconductor chip or over a considerably wide range of the same. The larger the size of the chip, therefore, the larger the number of the low threshold voltage transistors causing leakage. This leakage current has become a problem from a viewpoint of the power.

For example, "IEEE Journal of Solid-State Circuits, Vol. 31, No. 11, November 1996" and "IEEE Journal of Solid-State Circuits, Vol. 32, No. 11, November 1997" reported that the leakage current can no longer be ignored even during operation, for example, the leakage power becomes 20 mW in a maximum power of 450 mW and the leakage power becomes 4 mW for an active power of 17 mW.

For this reason, there may be cases where it becomes necessary to take measures like, as reported in for example "IEEE Journal of Solid-State Circuits, Vol. 30, No. 8, August 1995", suppressing the leakage current in the stand-by state by inserting a switch of a high threshold voltage transistor in series in a low threshold voltage transistor circuit and separating them in the stand-by state to reduce the leakage current or, as reported in "ISSCC95/Session 19/Technology Directions: Quantum Computing & Low-Power Digital", controlling the substrate bias to increase the threshold voltage in the stand-by state and thereby suppressing the leakage current.

Further, since low threshold voltage transistors have been used over a wider range than necessary in the related art, there was a fundamental problem that since low threshold voltage transistors were used even in a groups of paths having a fast speed and a small delay not requiring improvement of speed and away from critical paths, an unnecessarily large leakage current was generated.

This problem will be further explained with reference to the drawings.

FIG. 11 and FIG. 12 are views conceptually showing the delay distribution in delay transmission paths, or "delay paths", when making full use of transmission elements comprising low threshold voltage transistors. In the figures, the abscissas indicate the delay values, and the ordinates indicate the delay distribution. Further, in the figures, "1" denotes the delay distribution before lowering the threshold voltage, "2" denotes the delay distribution after lowering the threshold voltage, "3" denotes the maximum delay value before lowering the threshold voltage, and "4" denotes the maximum delay value, an improved value of the maximum delay value, after lowering the threshold voltage. As shown in FIG. 11, when lowering the threshold voltage, the speed is raised over the entire delay path.

However, the region in which the speed is faster than the improved value 4 of the maximum delay value is a part where it is meaningless speed-wise to use a low Vth to raise the speed.

Namely, the hatched part in FIG. 12 is a region where the speed is unnecessarily raised, that is, leakage is unnecessarily generated.

In this way, a means has been sought for efficiently suppressing an increase of the leakage current when using low threshold voltage transmission elements in the delay paths so as to lower the power and voltage.

SUMMARY OF THE INVENTION

An object of the present invention is to provide a semiconductor circuit capable of keeping the leakage current to a minimum while drawing out the maximum effect of improvement of the speed due to a reduction of the threshold voltage.

According to a first aspect of the present invention, there is provided a semiconductor circuit having a plurality of transmission paths, each transmission path having arranged in it at least one transmission element with a smaller amount of delay that is smaller than an absolute value of a set threshold value, wherein at least part of at least one transmission path among the plurality of transmission paths is arranged so that a low threshold voltage transmission element with an absolute value of the threshold voltage smaller than that of the other transmission elements.

Preferably, the low threshold transmission element is arranged in at least the transmission path with the largest delay value.

Preferably, the delay transmission paths to which the low threshold voltage transmission elements are applied are limited to the delay transmission paths in the range of delay from the maximum delay value before arrangement of the low threshold voltage transmission elements to about the permissible maximum value in a case where the low threshold voltage transmission elements are applied.

Preferably, a repeater buffer is inserted into a delay unit where a delay more than a predetermined value based on the interconnection resistance and the interconnection capacitance exist.

According to a second aspect of the present invention, there is provided a semiconductor circuit comprised of a plurality of functional units having arranged in it at least one transmission element with a smaller amount of delay the smaller than an absolute value of a set threshold value, wherein the threshold voltage of the transmission element in at least one functional unit is set to a lower threshold voltage than the transmission elements of other functional units.

Preferably, at least the substrates of functional units to be lowered in threshold voltage are isolated from the substrates of other functional units and the substrate potential of the functional units to be lowered in threshold voltage is adjusted to become lower than the normal threshold voltage.

Preferably, the functional units where the threshold voltages of the transmission elements are set to lower threshold voltages than the transmission elements of other functional units comprise transmission paths having delay value larger than the delay value of the transmission paths of the other function units.

According to the present invention, by applying a low threshold voltage over a limited range of application, the leakage current can be kept to a minimum while drawing out the maximum effect of improvement of the speed due to the reduction of the threshold voltage.

The range of application is the range from the maximum delay value before the lowering of the threshold voltage to the delay value improved by lowering the threshold voltage of the delay transmission path or the new maximum delay value when lowering the threshold voltage by a slower amount.

The threshold voltage is lowered at the transistor or cell level of the delay transmission path. As a result, there is the effect that it is possible to keep the scope of lowering of the threshold voltage to a minimum.

Conversely, by applying the present invention at a level of units where the range of application of the low threshold voltage is broad, the design is simplified.

Further, when the effect of increasing the speed due to the lowering of the threshold voltage becomes weaker due to an RC delay based on an interconnection resistance R and an interconnection capacitance C, a repeater buffer may be inserted into the RC delay unit to improve the effect.

Therefore, the range of application of the lower threshold voltage is efficiently widened. Further, the low threshold voltage is not applied to all elements in the delay transmission path covered by the lowering of the threshold voltage, but is selectively applied to the range of elements clearing the maximum delay.

Due to this, the leakage current can be efficiently suppressed while keeping the effect of improvement of speed as it is.

BRIEF DESCRIPTION OF THE DRAWINGS

The above object and features of the present invention will become more apparent from the following description of the preferred embodiments given with reference to the accompanying drawings, wherein.

DESCRIPTION OF THE PREFERRED EMBODIMENTS

First Embodiment

Figure 1:
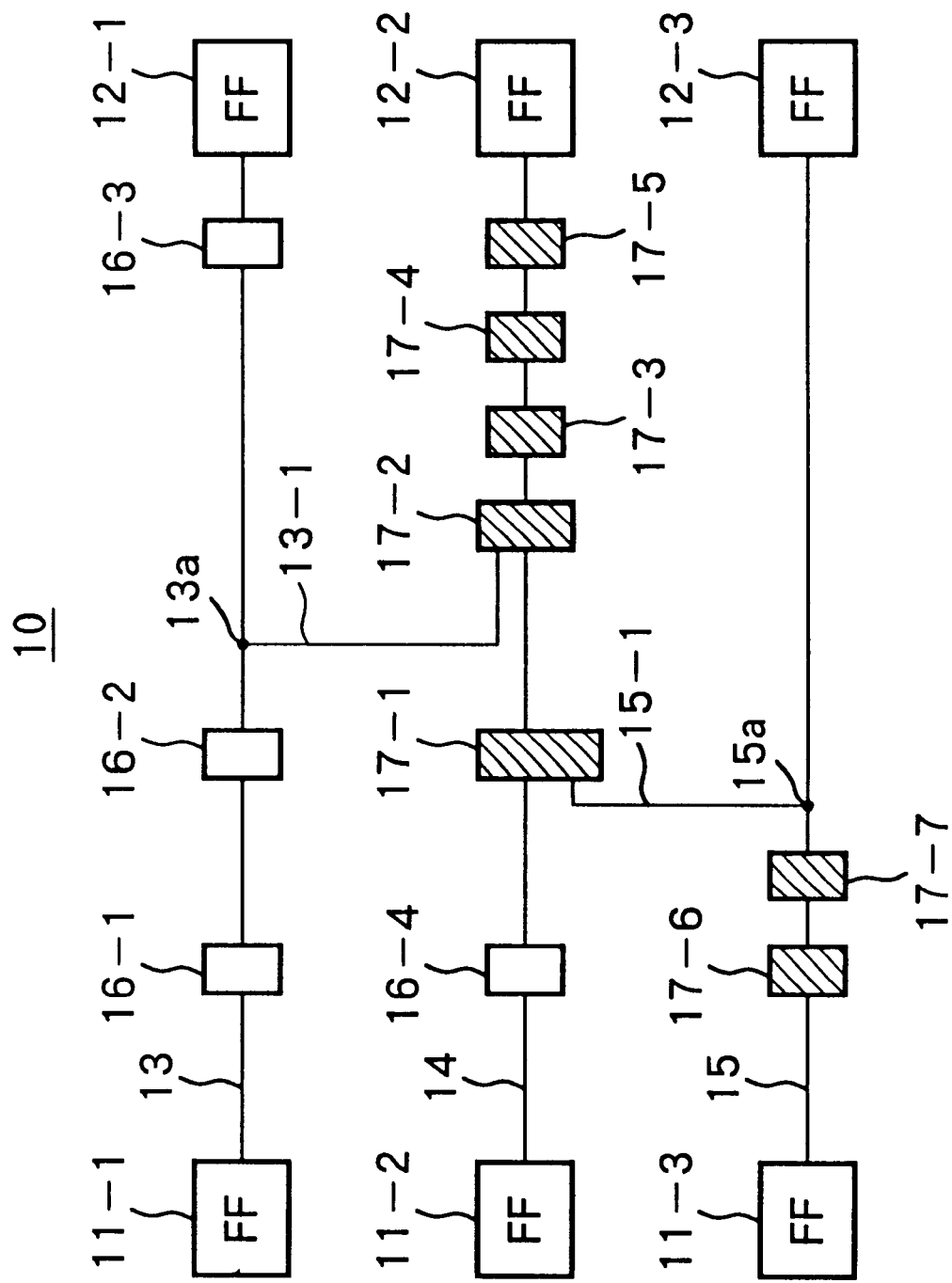
FIG. 1 is a block diagram of a semiconductor circuit according to a first embodiment of the present invention.

FIG. 1 is a block diagram of a semiconductor circuit according to a first embodiment of the present invention.

The present semiconductor circuit 10 is a synchronous system circuit and is constituted by signal transmission side flip-flops (FF) 11-1, 11-2, and 11-3, reception side flip-flops 12-1, 12-2, and 12-3, main transmission paths 13, 14, and 15 for respectively connecting the transmission side and the reception side flip-flops, branch paths 13-1 and 15-1, gate elements 16-1, 16-2, 16-3, and 16-4 as high threshold voltage transmission elements, and gate elements 17-1, 17-2, 17-3, 17-4, 17-5, 17-6, and 17-7 as low threshold voltage transmission elements shown as shaded to aid this explanation.

The main transmission path 13 is connected between an output of the signal transmission side flip-flop 11-1 and an input of the reception side flip-flop 12-1. The branch path 13-1 is branched from a branch point 13a of the main transmission path 13, and this branch path 13-1 is connected to one input terminal of the gate element 17-2.

The gate elements 16-1 and 16-2 are arranged in the main transmission path 13 between the output of the flip-flop 11-1 and the branch point 13a, while the gate element 16-3 is arranged in the main transmission path 13 between the branch point 13a and the input of the reception side flip-flop 12-1.

The main transmission path 14 is connected between the output of the signal transmission side flip-flop 11-2 and the input of the reception side flip-flop 12-2. The gate elements 16-4 and 17-1 to 17-5 are arranged in the main transmission path 14 between the output of the flip-flop 11-2 and the input of the reception side flip-flop 12-2.

Specifically, one input of the gate element 17-1 is connected to the output of the gate element 16-4, the output of the gate element 17-1 is connected to the other input of the gate element 17-2, and the gate elements 17-3 to 17-5 are respectively connected to the output side of, the gate element 17-2.

The main transmission path 15 is connected between the output of the signal transmission side flip-flop 11-3 and the input of the reception side flip-flop 12-3. The branch path 15-1 is branched from the branch point 15a of the main transmission path 15, and this branch path 15-1 is connected to one input terminal of the gate element 17-1.

The gate elements 17-6 and 17-7 are arranged in the main transmission path 15 between the output of the flip-flop 11-3 and the branch point 15a.

The gate elements 16-1, 16-2, 16-3, and 16-4 are constituted by using for example insulated gate type field effect transistors, that is, MIS system circuits. The threshold voltages Vth thereof are set to values higher than those of the gate elements 17-1 to 17-7, for example, about 0.8V similar to usual transistors in the case of for example NMOS transistors.

The gate elements 17-1 to 17-7 are constituted by using for example insulated gate type field effect transistors, that is, MIS system circuits. The threshold voltages Vth thereof are set to values lower than those of the gate elements 16-1 to 16-4, i.e., threshold voltages lower than the about 0.8V of usual transistors, for example, about 0.3V to 0.6V, in the case of for example, NMOS system enhancement type transistors. Further, the low threshold voltage transistors are constituted by depletion type transistors depending on the delay value of the delay path.

Note that the threshold voltage of an MOS transistors is set by adjusting the concentration of addition of the impurity in, for example, the manufacturing process.

Further, it is also possible to configure the circuit to lower the threshold voltage by switching the substrate voltage of an MOS transistor having a usual threshold voltage from, for example, a certain negative potential to a higher voltage at least at the time of signal transmission.

Further, the lower threshold voltage is applied in units of transistors or units of cells.

Figure 2:
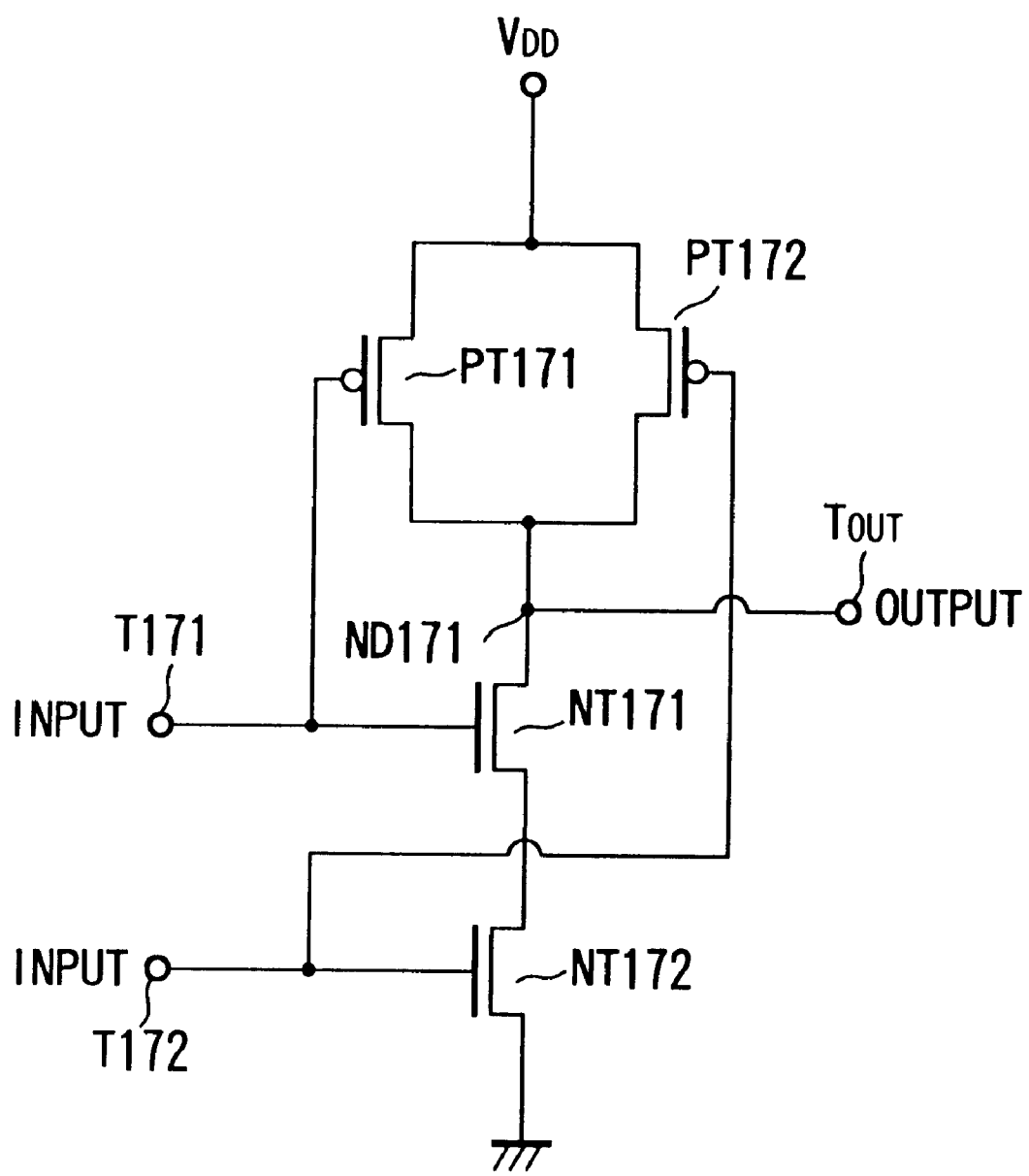
FIG. 2 is a circuit diagram of an example of the configuration of a gate element according to the present invention.

FIG. 2 is a circuit diagram of an example of the configuration of the gate element 17-1 or 17-2 of FIG. 1.

FIG. 2 is an example of a case where the gate element is constituted as a NAND circuit.

The NAND circuit shown in FIG. 2 is constituted by low threshold voltage p-channel MOS (PMOS) transistors PT171 and PT172 and enhancement type NMOS transistors NT171 and NT172.

The PMOS transistors PT171 and PT172 are connected in parallel between a supply line of the power supply voltage VDD and an output node ND171, while the NMOS transistors NT171 and NT172 are connected in series between the output node ND171 and a ground line.

An input terminal T171 is connected to gates of the PHOS transistor PT171 and the NMOS transistor NT171, while an input terminal T172 is connected to gates of the PMOS transistor PT172 and the NMOS transistor NT172.

The input transistor T171 is connected to the main transmission path 15 shown in FIG. 1 at the output of the element 16-4, an input terminal T172 is connected to the branch path 15-1, and an output terminal $T_{OUT}$ is connected to the other input terminal of the gate element 17-2.

In this NAND circuit, both of the NMOS transistors NT171 and NT172 become the conductive state and the output level becomes the low level only when the signal level of the main transmission path 15 and the branch path 15-1 is at a high level.

To which value the low threshold voltage of an enhancement type transistor is set or if a depletion type transistor is used is determined by considering whether or not application of a gate element as a low threshold voltage transmission element can solve the problems of the unnecessary increase in speed of the delay path and the accompanying unnecessary leakage and the necessity for measures in the stand-by state and whether enables the effect of improvement of the speed due to the application of low threshold voltage gate elements to be drawn out to the maximum while minimizing the leakage current, that is, whether application can be limited to the optimum range.

Below, the optimum range of application of the low threshold voltage according to the first embodiment will be explained with reference to FIG. 3.

Figure 3:
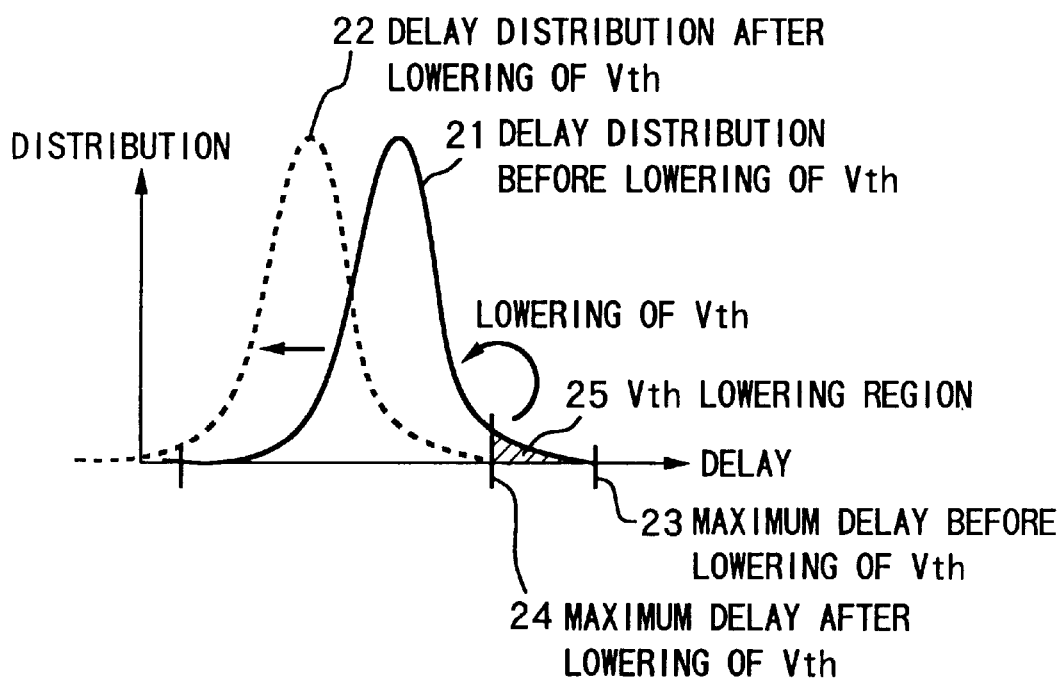
FIG. 3 is a view conceptually showing a delay distribution of the delay transmission path, or "delay paths", for explaining a limited range of application of low threshold voltage transistors according to the first embodiment.

FIG. 3 is a view conceptually showing the delay distribution of delay transmission paths, or "delay paths", for explaining the limited range of application of the low threshold voltage transistors according to the present invention.

In the figure, the abscissa represents the delay value, while the ordinate represents the delay distribution. In the figure, 21 denotes the state of distribution of delay paths before the lowering of the threshold voltage, i.e., how many delay paths exist at that delay; 22 denotes the delay distribution state after the lowering of the threshold voltage; 23 denotes the maximum delay value before the lowering of the threshold voltage; 24 denotes the maximum delay value, i.e., an improved value of the maximum delay value after the lowering of the threshold voltage, and 25 denotes the low threshold voltage application region.

In the synchronous system semiconductor circuit 10 of FIG. 1, the delay path with the maximum original delay value is the transmission path of the flip-flop 11-3→ main transmission path 15→ gate elements 17-6, 17-7→ branch path 15-1→ gate element 17-1→ main transmission path 14→ gate elements 17-2 to 17-5→ flip-flop 12-2. Due to the application of the low threshold voltage gate elements 17-1 to 17-7, the maximum delay value thereof becomes the position of 24.

This delay value 24 is also the maximum delay obtained by applying low threshold voltage gate elements to the entire chip. All of the other delay paths to which low threshold voltage gate elements are applied become paths having a higher speed than the position of this maximum value 24 and become factors behind useless leakage and so forth.

Therefore, in the first embodiment, the delay paths to which the low threshold voltage gate elements are applied are limited to the delay paths in the range from the maximum delay value 23 before the lowering of the threshold voltage, at a higher speed than this, to the new maximum delay value 24 in a case where the low threshold voltage gate elements are applied, at a lower speed than this.

In FIG. 3, the hatched part is that range of application.

Namely, the low threshold voltage gate elements are applied to this region to increase the speed to under the delay value indicated by 24, that is, to keep it concealed below the new maximum delay value 24.

By applying the low threshold voltage gate elements limited to only the delay paths in this region, the effect of improvement of the speed due to the lowering of the threshold voltage is drawn out to the maximum limit, that is, the delay becomes similar to the case where the low threshold voltage gate elements are applied to the entire chip.

Since the low threshold voltage gate elements are applied to only the delay paths in the region limited to the minimum, the leakage current due to the low threshold voltage transistors is suppressed to the minimum. Thus, the generation of an unrequited leakage current is prevented.

Further, the possibility that the leakage current in the stand-by state will be in the permissible range becomes high.

In the semiconductor circuit 10 of FIG. 1, the signal transmitted through the main transmission path 13 passes through three gate elements 16-1 to 16-3 constituted by using high threshold voltage transistors and is input to the reception side flip-flop 12-1 without generating unrequired leakage and in addition without a large delay.

Further, the signal transmitted through the main transmission path 14 passes through the gate element 16-4 constituted by using one high threshold voltage transistor and five low threshold voltage gate elements 17-1 to 17-5 and input to the reception side flip-flop 12-2.

In this case, since the low threshold voltage gate elements are applied on a limited basis, the effect of improvement of speed due to the lowering of the threshold voltage is drawn out to the maximum, while the leakage current due to the low threshold voltage transistors is kept to the minimum.

Further, the signal transmitted through the main transmission path 15 passes through two low threshold voltage gate elements 17-6 and 17-7 and is input to the reception side flip-flop 12-3.

In this case as well, since the low threshold voltage gate elements are applied on a limited basis, the effect of improvement of speed due to the lowering of the threshold voltage is drawn out to the maximum, while the leakage current due to the low threshold voltage transistor is kept to the minimum.

Further, the signal output from the gate element 17-7 is propagated to the branch path 15-1, passes through the five low threshold voltage gate elements 17-1 to 17-5, and is input to the reception side flip-flop 12-2.

In this case as well, since the low threshold voltage gate elements are applied on a limited basis, the effect of improvement of speed due to the lowering of the threshold voltage is drawn out to the maximum, while the leakage current due to the low threshold voltage transistor is kept to the minimum.

As explained above, according to the first embodiment, the delay paths to which the low threshold voltage gate elements are applied are limited to the delay paths in the range from the maximum delay value 23 before the lowering of the threshold voltage, at a higher speed than this, to the new maximum delay value 24 in the case where the low threshold voltage gate elements are applied, at a lower speed than this. Therefore, the leakage current due to the low threshold voltage transistors can be kept to the minimum while drawing out the effect of improvement of speed due to the lowering of the threshold voltage to the maximum, so the problem of the unrequired leakage current applied to the chip over a wide range as in the related art can be solved.

Further, the possibility that the leakage current in the stand-by state is in the permissible range becomes high.

Further, of course, the boundary of the range of application of the low threshold voltage gate elements is not much out of the range intended by the present invention. Therefore, the present invention is effective, even if it does not completely strictly coincide with the improved value obtained by lowering the threshold voltage of the original maximum delay or the new maximum delay mentioned later.

In FIG. 1, the present invention is applied to only one path, but, of course, the present invention may be applied to the more than one delay path in the application region in actuality.

Further, in the first embodiment, the example of a synchronous circuit is shown, but needless to say the present invention can also be applied to an asynchronous circuit.

Second Embodiment

Figure 4:
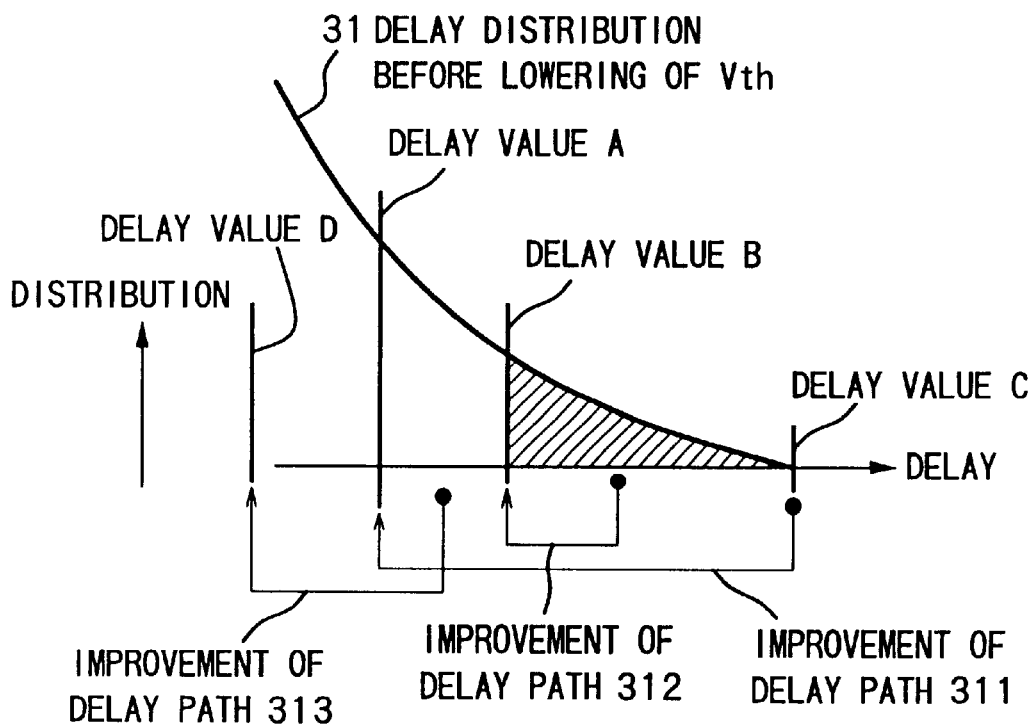
FIG. 4 is a view for explaining a semiconductor circuit according to a second embodiment of the present invention and conceptually showing the delay distribution of the delay transmission paths, or "delay paths" for explaining the limited range of application of low threshold voltage transistors according to the present invention.

FIG. 4 is a view explaining a semiconductor circuit according to a second embodiment of the present invention and conceptually showing the delay distribution of delay transmission paths, or "delay paths", for explaining the limited range of application of the low threshold voltage transistors according to the present invention.

In the figure, the abscissa represents the delay value, while the ordinate represents the delay distribution. In the figure, curve 31 denotes the distribution state of the delay paths before the lowering of the threshold voltage. i.e., how many delay paths exist at that delay.

In the second embodiment, for example, a delay path 311 has become the maximum delay path with the delay value C under the high threshold voltage and becomes the delay value A by the application of the low threshold voltage transmission elements.

The delay path 312 is improved to the delay value B by the application of the low threshold voltage transmission elements.

The delay path 313 is improved to the delay value D if the threshold voltage is lowered.

Ordinarily, the delay value A obtained by improvement of the original maximum delay value C becomes the improved maximum delay value, but when the improvement stops at the delay value B slower than the delay value A as in the delay path 312 in the figure for some reason or another, the delay path 313 does not contribute to the improvement of the maximum delay value even if the threshold voltage is lowered.

This is because sometimes a so-called RC delay due to the interconnection resistance R and the interconnection capacitance C is interposed and the RC delay per se is not affected by the lowering of the threshold voltage.

At this time, the increase of the leakage current due to the unnecessary lowering of the threshold voltage not contributing to the improvement of the delay can be prevented by limiting the range of application of the low threshold voltage to the range from the maximum delay value B after improvement to the original maximum delay value C.

In this way, according to the second embodiment, when there is a delay transmission path having a large delay value greater than the delay value of the maximum delay transmission path before arranging the low threshold voltage transmission elements after improvement by arranging the low threshold voltage transmission elements irrespective of arranging the low threshold transmission elements and that delay transmission path becomes the new maximum delay, it is possible to prevent an increase of the leakage current due to the unnecessary lowering of the threshold voltage not contributing to the improvement of delay by limiting the range of application of the low threshold voltage to the delay transmission paths in the range from the maximum delay value C before arranging the low threshold voltage transmission elements to about the new maximum delay value B.

Third Embodiment

Figure 5:
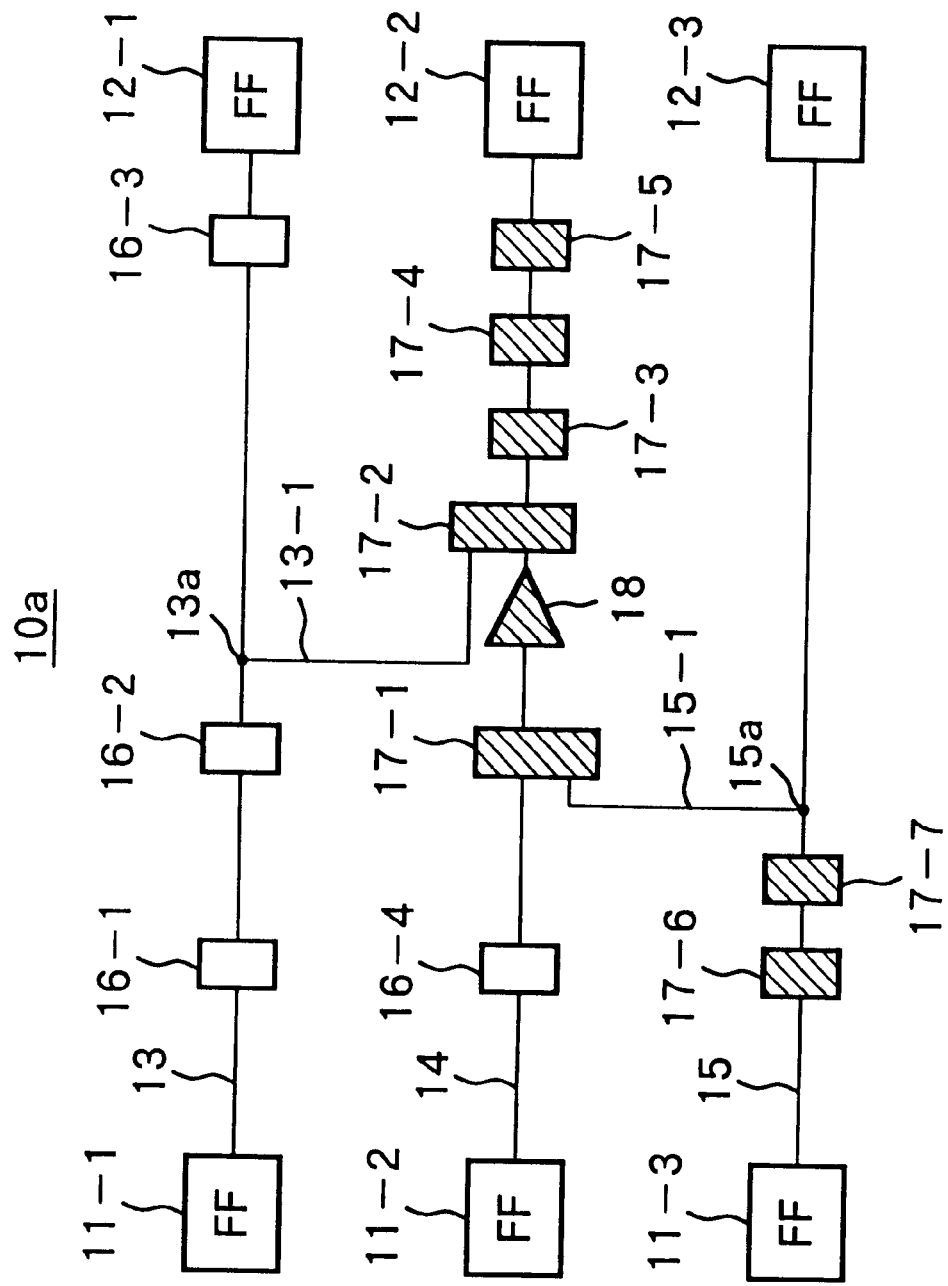
FIG. 5 is a block diagram of a semiconductor circuit according to a third embodiment of the present invention.

FIG. 5 is a block diagram of a semiconductor circuit according to a third embodiment of the present invention.

In the third embodiment, in the circuit of FIG. 1 showing the first embodiment, a so-called repeater buffer 18 is provided in the main transmission path 14 connecting the low threshold voltage gate element 17-1 and the gate element 17-2. Note that, in the third embodiment, an example is shown in which the repeater buffer 18 is also made a low threshold voltage, but the present invention is not restricted to this.

This repeater buffer 18 is inserted into the delay unit of a delay transmission path in which the improvement of speed due to the arrangement of the low threshold voltage gate elements is smaller than the improvement of the maximum delay transmission path before arranging the low threshold voltage gate elements due to the RC delay based on the interconnection resistance R and the interconnection capacitance C and this becomes the new maximum delay.

In the third embodiment, this delay unit is explained as the main transmission path 14 for connecting the gate element 17-1 and the gate element 17-2, but of course the invention is not restricted to this transmission path.

Figure 6:
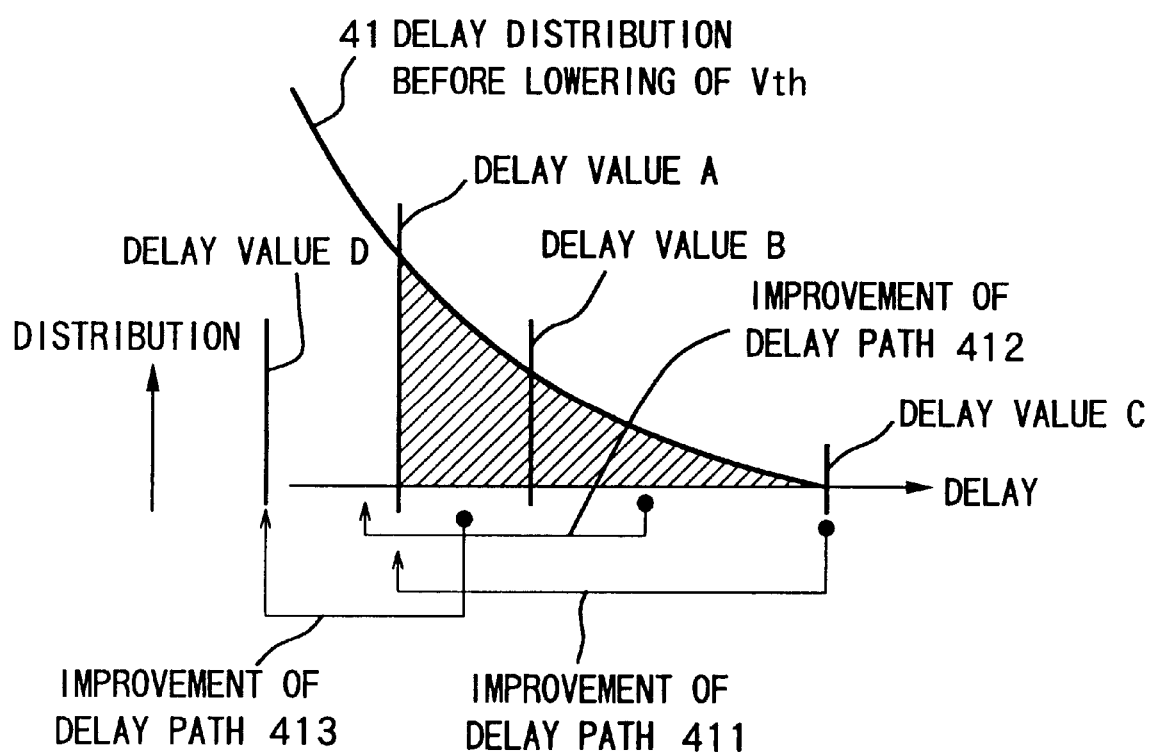
FIG. 6 is a view for explaining the semiconductor circuit according to the third embodiment of the present invention and conceptually showing the delay distribution of the delay transmission paths, or "delay paths", for explaining the limited range of application of low threshold voltage transistors according to the present invention.

FIG. 6 is a view for explaining the semiconductor circuit according to the third embodiment of the present invention and conceptually shows the delay distribution of delay transmission paths, or "delay paths", for explaining the limited range of application of the low threshold voltage transistors according to the present invention.

In the figure, the abscissa represents the delay value, while the ordinate represents the delay distribution. In the figure, curve 41 denotes the distribution state of the delay paths before the lowering of the threshold voltage, i.e., how many delay paths exist at that delay.

In the third embodiment, as in the second embodiment explained above, when a delay path which is not the original maximum delay becomes the new maximum delay transmission path and the cause thereof is the RC delay, by inserting the repeater buffer 18 into the RC delay unit, the pure RC delay component is reduced and the effect due to the lowering of the threshold voltage is raised, so the improvement of delay as in the delay path 312 of FIG. 4 is improved as in the delay path 412 of FIG. 6 and the limited range of application of the low threshold voltage is extended from the delay value A to the delay value C and thus improvement of the speed is achieved.

Here, if the improvement by the repeater buffer 18 does not reach the delay value A but stops before this, as in FIG. 4 indicating the second embodiment, the range from the maximum delay value after improvement up to the delay value C becomes the range of application of the low threshold voltage.

According to the third embodiment, there is the advantage that when the effect of improvement of speed due to the lowering of the threshold voltage becomes weaker due to an RC delay, the range of application of the low threshold voltage can be efficiently broadened by inserting the repeater buffer into the RC delay.

Fourth Embodiment

Figure 7:
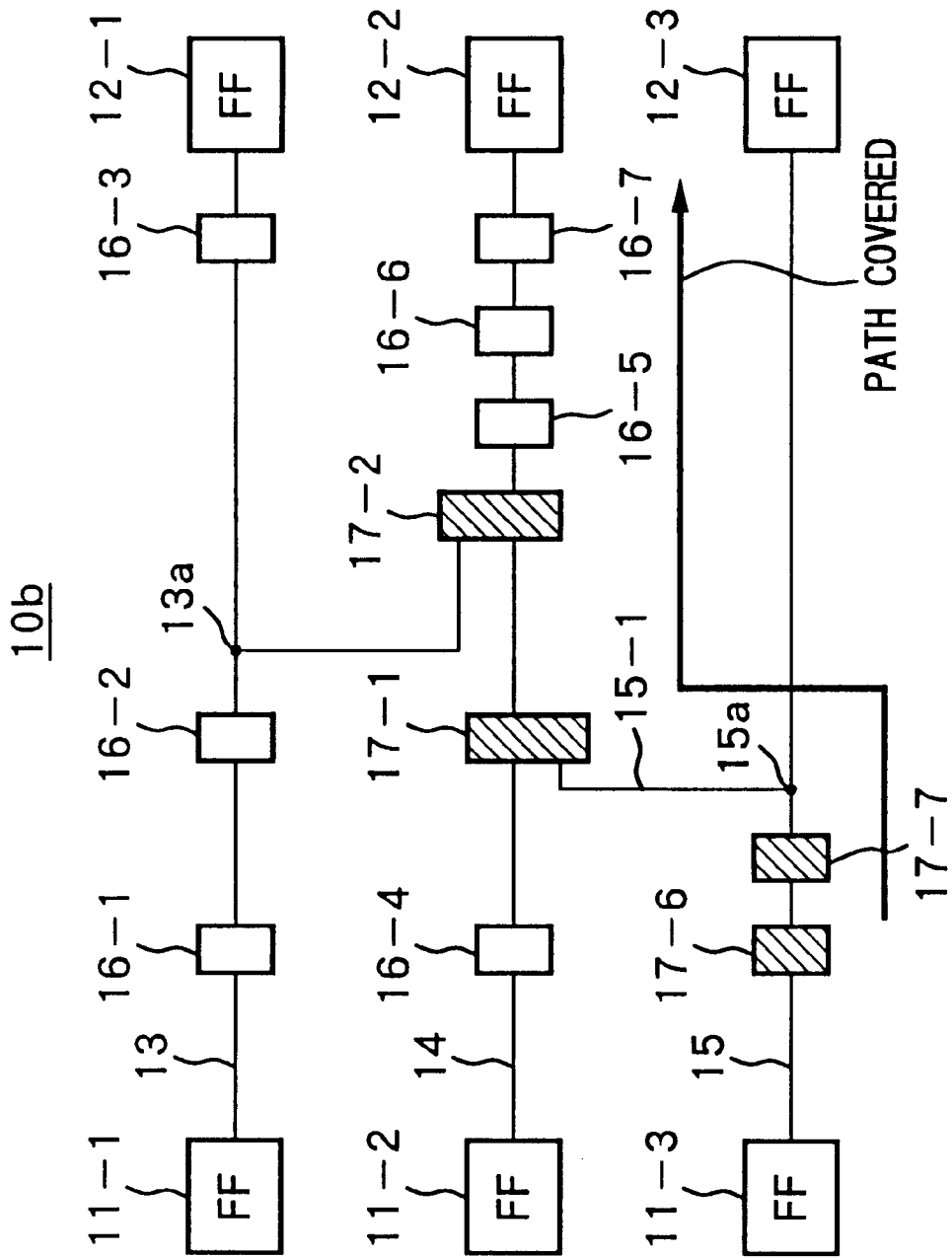
FIG. 7 is a view of a semiconductor circuit according to a fourth embodiment of the present invention.

FIG. 7 is a block diagram of a semiconductor circuit according to a fourth embodiment of the present invention.

The difference of the fourth embodiment from the first embodiment resides in that not all of the gate elements arranged in the transmission path of the flip-flop 11-3→ main transmission path 15→ branch path 15-1→ main transmission path 14→ flip-flop 12-2, that is, the delay path with the original maximum delay value, are lowered in threshold voltages, but only part of the gate elements are lowered in threshold voltage.

Specifically, in FIG. 7, in place of the gate elements 17-3, 17-4, and 17-5 arranged between the output of the low threshold voltage gate element 17-2 and the input of the flip-flop 12-2, gate elements 16-5, 16-6, and 16-7 constituted by using transistors with high threshold voltages are arranged.

Figure 8:
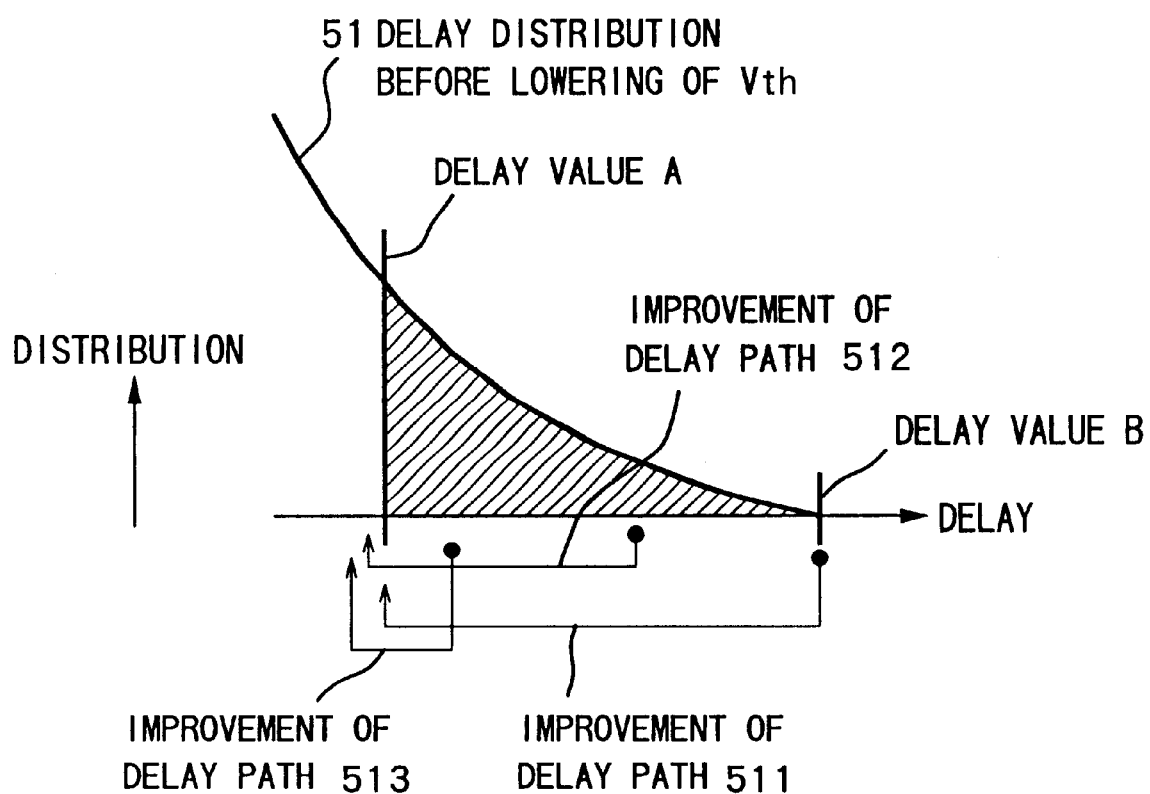
FIG. 8 is a view for explaining the semiconductor circuit according to the fourth embodiment of the present invention and conceptually showing the delay distribution of the delay transmission paths or (delay paths) for explaining the limited range of application of low threshold voltage transistors according to the present invention.

FIG. 8 is a view explaining the semiconductor circuit according to the fourth embodiment of present invention and conceptually showing the delay distribution of the delay transmission paths, or "delay paths", for explaining the limited range of application of the low threshold voltage transistors according to the present invention.

In the figure, the abscissa represents the delay value, while the ordinate represents the delay distribution. In the figure, curve 51 indicates the distribution state of the delay paths before the lowering of the threshold voltage, i.e., how many delay paths exist at that delay.

In the fourth embodiment, the transistors and cells lowered in threshold voltage in the delay paths 512 and 513 are reduced in the range of speed higher than the delay value A of the maximum delay transmission path. Due to this, after sufficiently obtaining the effect of improvement of speed due to the lowering of the threshold voltage, the range of further lowering of the threshold voltage is reduced and thus the leakage current can be suppressed.

As described above, according to the fourth embodiment, not all elements in the delay path covered by the lowering of the threshold voltage are lowered in voltage, but the threshold voltage is selectively lowered in a range where the maximum delay is cleared, therefore the leakage current can be suppressed while maintaining the effect of improvement of speed with a high efficiency.

Fifth Embodiment

Figure 9:
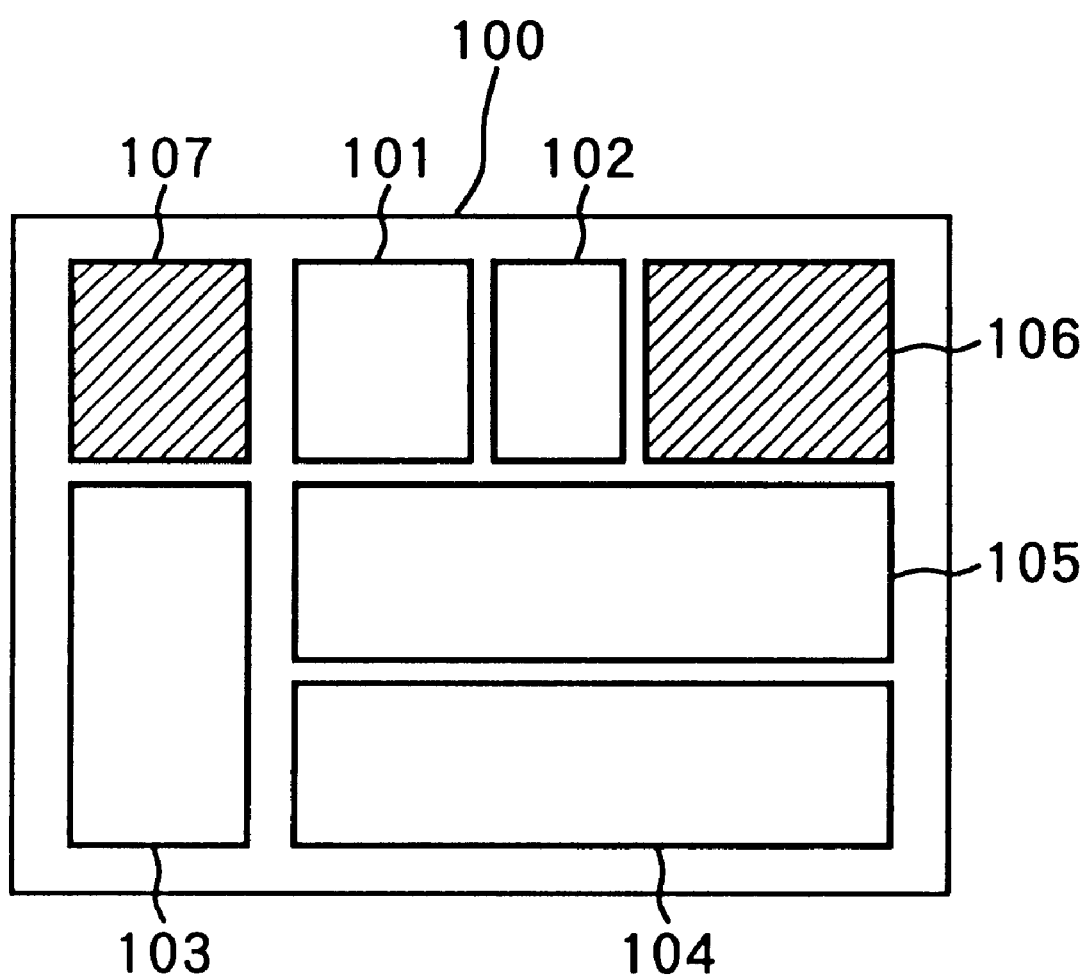
FIG. 9 is a block diagram for explaining a semiconductor circuit according to a fifth embodiment of the present invention.

FIG. 9 is a block diagram explaining a semiconductor circuit according to a fifth embodiment of the present invention.

In the fifth embodiment, the functional units 101 to 107 formed in the semiconductor chip 100 are divided into the functional units 101 to 105 using the high threshold voltage transistors and the functional units 106 and 107 lowered in threshold voltage.

Namely, in the fifth embodiment, compared with the first to fourth embodiments, the threshold voltage is lowered at the level of units where the range of application of the low threshold voltage is broader than a predetermined standard.

According to the fifth embodiment, the effect of suppressing the leakage is weaker in comparison with the cases of the first to fourth embodiments, but there is the advantage that the design can be simplified.

Sixth Embodiment

Figure 10:
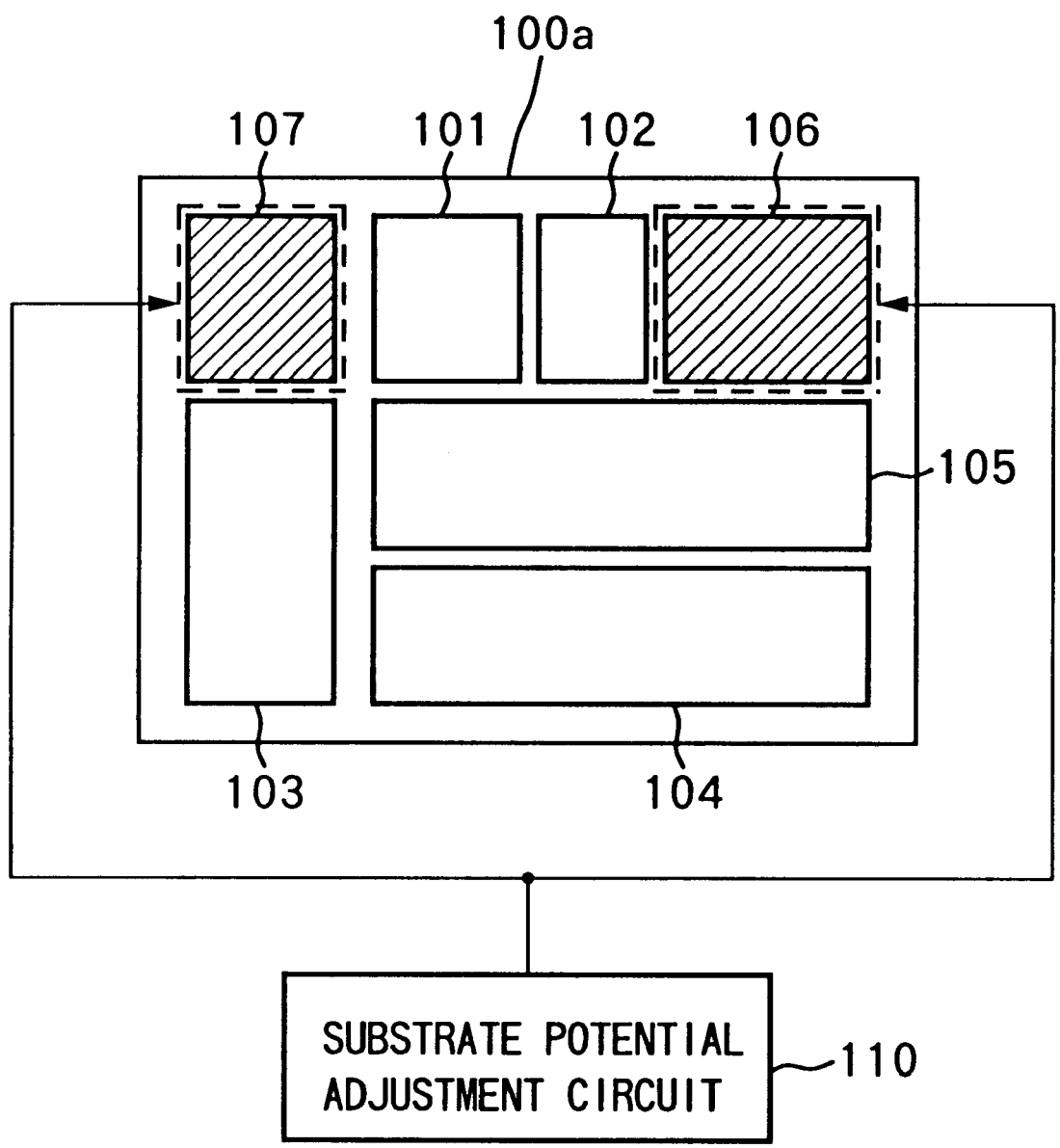
FIG. 10 is a block diagram for explaining a semiconductor circuit according to a sixth embodiment of the present invention.
Figure 11:
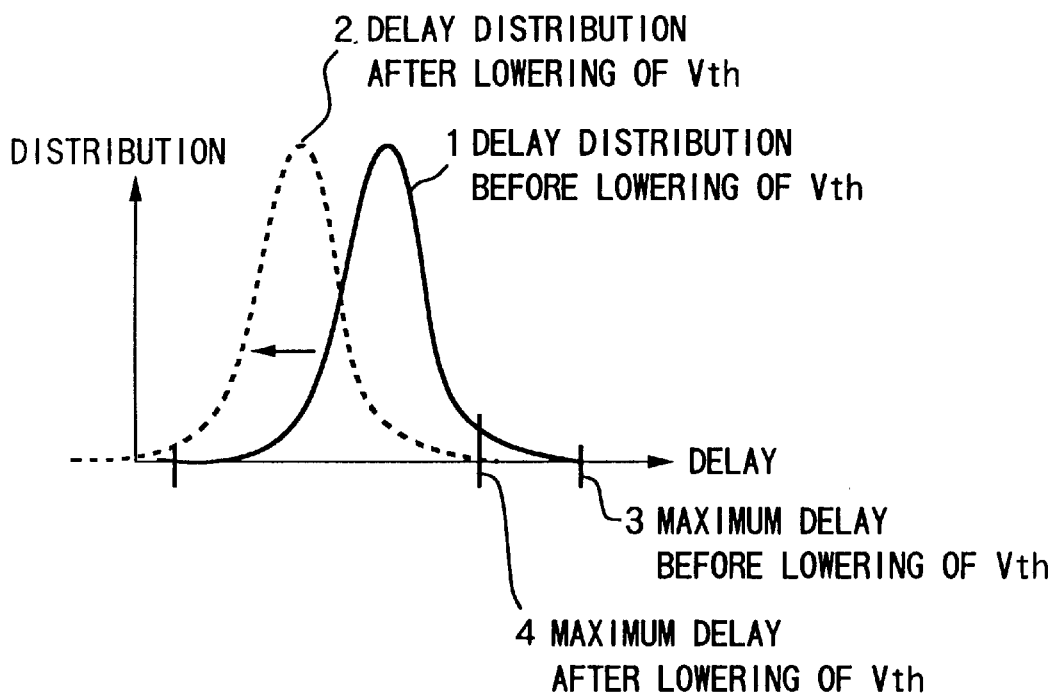
FIG. 11 is a view conceptually showing the delay distribution of the delay transmission paths, or "delay paths", when using entirely transmission elements comprising transistors having a low threshold voltage.
Figure 12:
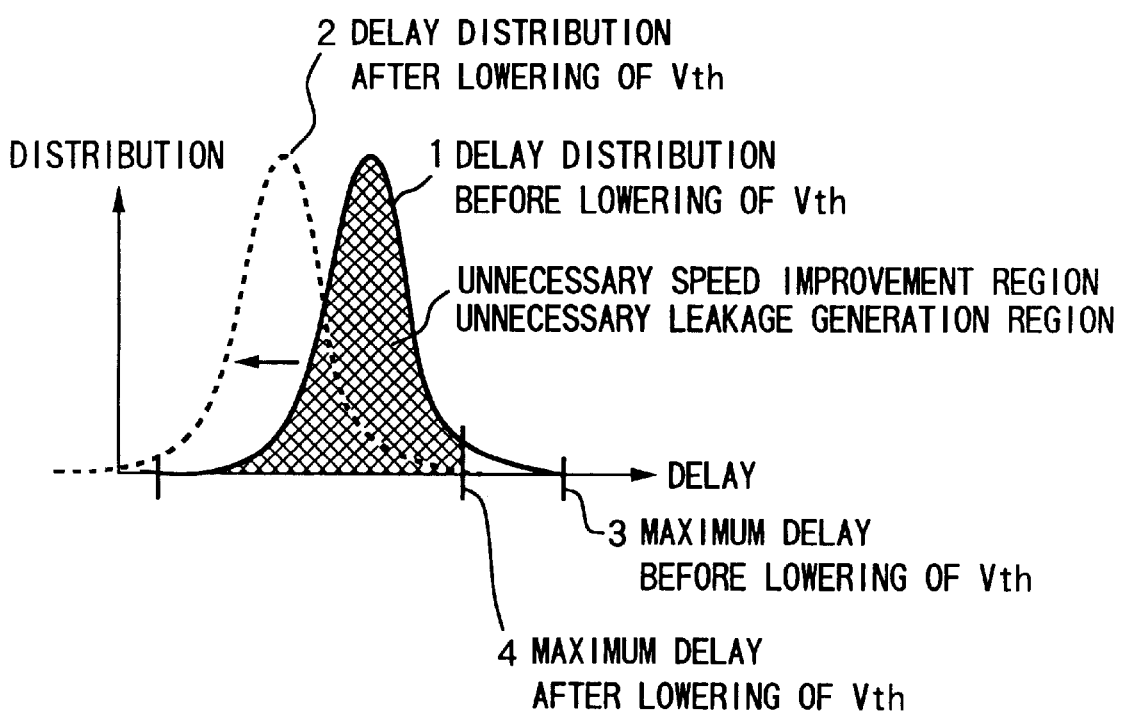
FIG. 12 is a view conceptually showing the delay distribution of the delay transmission paths, or "delay paths", when using entirely transmission elements comprising transistors having a low threshold voltage and explaining the problem of the related art.

FIG. 10 is a block diagram explaining a semiconductor circuit 100a according to a sixth embodiment of the present invention.

The difference of the sixth embodiment from the fifth embodiment resides in the electrical insulation by the substrate of the functional units 101 to 105 using the high threshold voltage transistors and the functional units 106 and 107 lowered in threshold voltage among the functional units 101 to 107 formed in the semiconductor chip 100 (indicated by a broken line in the figure) and the provision of a substrate potential adjustment circuit 110 for adjusting the substrate potential of these substrate isolated functional units 106 and 107 so that the threshold voltages of the transistors constituting the functional units become lower.

The substrate potential adjustment circuit 110 adjusts the substrate potential from a certain negative voltage to a higher voltage to lower the threshold voltage when the transistors constituting the functional units 106 and 107 are for example NMOS transistors.

Namely, in the sixth embodiment, compared with the cases of the first to fourth embodiments, the threshold voltage is lowered at the level of units where the range of application of the low threshold voltage is broader than a predetermined standard.

According to the sixth embodiment, like in the fifth embodiment, the effect of suppressing the leakage is weaker in comparison with the cases of the first to fourth embodiments, but there is the advantage that the design can be simplified.

Summarizing the effects of the invention, as explained above, according to the present invention, by applying the low threshold voltage to a limited range, the leakage current can be kept to a minimum while drawing out the effect of improvement of speed due to the lowering of the threshold voltage to the maximum.

Further, since the threshold voltage is lowered at the transistor and cell level of the delay path, there is the advantage that it is possible to optimally minimize the range of the lowering of the threshold voltage.

Further, according to the present invention, since a repeater buffer is inserted into the RC delay unit when the effect of improvement of speed due to the lowering of the threshold voltage becomes weaker due to the RC delay based on the interconnection resistance and the interconnection capacitance, there is the advantage that the range of application of the low threshold voltage can be efficiently expanded.

Further, according to the present invention, by selectively applying the low threshold voltage to not all elements in the delay path covered by the lowering of the threshold voltage, but to the range of transmission elements clearing the maximum delay when lowered in threshold voltage, the leakage current can be suppressed while keeping the effect of improvement of speed with a higher efficiency.

Further, according to the present invention, since the present invention is applied at the level of units where the range of application of the low threshold voltage is broad, there is the advantage that the design can be simplified.

While the invention has been described with reference to specific embodiments chosen for purpose of illustration, it should be apparent that numerous modifications could be made thereto by those skilled in the art without departing from the basic concept and scope of the invention.

What is claimed is:

1. A semiconductor circuit, which comprises: a plurality of transmission paths, each transmission path having arranged in it at least one transmission element with a delay that decreases as an absolute value of a set threshold value is decreased, wherein at least part of at least one transmission path among the plurality of transmission paths has arranged in it a low threshold voltage transmission element with an absolute value of the threshold voltage smaller than that of other transmission elements.

2. A semiconductor circuit as set forth in claim 1, wherein the low threshold transmission element is arranged in at least the transmission path with the largest delay value.

3. A semiconductor circuit as set forth in claim 1, wherein the delay transmission paths to which the low threshold voltage transmission elements are applied are limited to the delay transmission paths in the range of delay from the maximum delay value before arrangement of the low threshold voltage transmission elements to about the permissible maximum value in a case where the low threshold voltage transmission elements are applied.

4. A semiconductor circuit as set forth in claim 1, wherein a repeater buffer is inserted into a delay unit where a delay more than a predetermined value based on the interconnection resistance and the interconnection capacitance exist.

5. A semiconductor circuit comprised of a plurality of functional units, said semiconductor circuit having at least one transmission element with a delay that decreases as an absolute value of a set threshold value is decreased, wherein a threshold voltage of said at least one transmission element in at least one functional unit is set to a lower threshold voltage than transmission elements of other functional units.

6. A semiconductor circuit as set forth in claim 5, wherein at least any substrates of said at least one functional unit having said at least one transmission element is isolated from any other substrates of other functional units, and a substrate potential of the said at least one functional unit having said at least one transmission element is adjusted to become lower than a normal threshold voltage.

7. A semiconductor circuit as set forth in claim 5, wherein the functional units where the threshold voltages of the transmission elements are set to lower threshold voltages than the transmission elements of other functional units comprise transmission paths having a delay value larger than the delay value of the transmission paths of the other functional units.

8. A semiconductor circuit as set forth in claim 6, wherein the functional units where the threshold voltages of the transmission elements are set to lower threshold voltages than the transmission elements of other functional units comprise transmission paths having delay value larger than the delay value of the transmission paths of the other functional units.

* * * * *

UNITED STATES PATENT AND TRADEMARK OFFICE
CERTIFICATE OF CORRECTION

PATENT NO. : 6,222,410 B1
DATED : April 24, 2001
INVENTOR(S) : Katsunori Seno

It is certified that error appears in the above-identified patent and that said Letters Patent is hereby corrected as shown below:

<u>Title page,</u>
Item [73], Assignee, should read:
-- [73] Assignee: Sony Corporation, Tokyo, JP --

Signed and Sealed this

Twenty-first Day of September, 2004

JON W. DUDAS
*Director of the United States Patent and Trademark Office*